(12) United States Patent
Nicke et al.

(10) Patent No.: US 11,050,145 B2
(45) Date of Patent: Jun. 29, 2021

(54) METHOD FOR PRODUCING A RADOME AND CORRESPONDING RADOME

(71) Applicant: HELLA GMBH & CO. KGAA, Lippstadt (DE)

(72) Inventors: Wolfgang Nicke, Lörrach (DE); Frank Pakebusch, Cottbus (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 0 days.

(21) Appl. No.: 15/764,497

(22) PCT Filed: Sep. 23, 2016

(86) PCT No.: PCT/EP2016/072671
§ 371 (c)(1),
(2) Date: Mar. 29, 2018

(87) PCT Pub. No.: WO2017/055182
PCT Pub. Date: Apr. 6, 2017

(65) Prior Publication Data
US 2018/0269569 A1    Sep. 20, 2018

(30) Foreign Application Priority Data
Sep. 30, 2015 (DE) ...................... 10 2015 218 841.8

(51) Int. Cl.
*H01Q 1/02* (2006.01)
*H01Q 1/42* (2006.01)
(Continued)

(52) U.S. Cl.
CPC .......... *H01Q 1/425* (2013.01); *G01S 13/931* (2013.01); *H01Q 1/02* (2013.01); *H01Q 1/42* (2013.01);
(Continued)

(58) Field of Classification Search
CPC ...... H01Q 1/02; H01Q 1/1278; H01Q 1/3233; H01Q 1/42; H01Q 1/422; H01Q 1/425; H01Q 1/427; H05K 1/0212
See application file for complete search history.

(56) References Cited

U.S. PATENT DOCUMENTS

| 5,617,107 A * | 4/1997 | Fleming ................. H01Q 1/02 343/704 |
| 6,433,753 B1 * | 8/2002 | Zimmermann .......... H01Q 1/02 219/522 |

(Continued)

FOREIGN PATENT DOCUMENTS

| DE | 197 24 320 A1 | 12/1998 |
| DE | 10 2004 049 148 A1 | 4/2006 |

(Continued)

OTHER PUBLICATIONS

International Search Report, PCT/EP2016/072671, dated Dec. 8, 2016, 2 pgs.
(Continued)

*Primary Examiner* — Dimary S Lopez Cruz
*Assistant Examiner* — Patrick R Holecek
(74) *Attorney, Agent, or Firm* — Paul D. Strain, Esq.; Strain & Strain PLLC

(57) ABSTRACT

The invention relates to a method for producing a heatable radome, a flexible printed circuit board having a metallic structure being used. Said flexible printed circuit board is embossed and is back-molded with a thermoplastic material.

10 Claims, 2 Drawing Sheets

(51) Int. Cl.
*G01S 13/931* (2020.01)
*H05K 1/02* (2006.01)
*H05B 3/84* (2006.01)
*H05K 3/28* (2006.01)
*G01S 7/40* (2006.01)
*H05B 3/36* (2006.01)
*H05B 3/86* (2006.01)

(52) U.S. Cl.
CPC ............... *H05B 3/84* (2013.01); *H05K 1/028* (2013.01); *H05K 1/0212* (2013.01); *H05K 3/28* (2013.01); *G01S 7/40* (2013.01); *G01S 2007/4047* (2013.01); *G01S 2013/9327* (2020.01); *H05B 3/36* (2013.01); *H05B 3/86* (2013.01); *H05B 2203/017* (2013.01); *H05K 2203/02* (2013.01); *H05K 2203/1327* (2013.01)

(56) References Cited

U.S. PATENT DOCUMENTS

| | | | | |
|---|---|---|---|---|
| 7,326,894 B2* | 2/2008 | Meiler | ...................... | H01Q 1/02 219/663 |
| 7,420,502 B2* | 9/2008 | Hartzstein | ............... | G01S 7/032 342/175 |
| 7,704,427 B2* | 4/2010 | Fujii | .................... | B29C 45/1671 264/248 |
| 9,559,421 B2* | 1/2017 | Nakamura | ................ | H01F 5/04 |
| 2006/0284335 A1 | 12/2006 | Fujii | | |
| 2011/0221640 A1* | 9/2011 | Huber | .................. | H01Q 1/1214 343/713 |

FOREIGN PATENT DOCUMENTS

| | | |
|---|---|---|
| DE | 10 2009 029 763 A1 | 12/2010 |
| DE | 10 2012 213 917 A1 | 2/2014 |
| DE | 10 2013 008 488 A1 | 11/2014 |
| DE | 10 2013 012 785 A1 | 2/2015 |
| DE | 10 2013 221 064 A1 | 4/2015 |
| DE | 10 2014 214 329 A1 | 1/2016 |
| EP | 1 160 914 B1 | 8/2004 |
| GB | 885131 A * 12/1961 | ............. B64D 15/12 |

OTHER PUBLICATIONS

German Search Report, Appl. No. 10 2015 218 841.8, dated May 19, 2016, 9 pgs.

* cited by examiner

METHOD FOR PRODUCING A RADOME AND CORRESPONDING RADOME

CROSS-REFERENCE TO RELATED PATENT APPLICATIONS

This application is a National Stage of International Application No. PCT/EP2016/072671, filed Sep. 23, 2016, which is based upon and claims the benefit of priority from prior German Patent Application No. 10 2015 218 841.8, filed Sep. 30, 2015, the entire contents of all of which are incorporated herein by reference in their entirety.

TECHNICAL FIELD

The invention relates to a beatable radome, in particular for a motor vehicle, and to a method for producing a heatable radome.

PRIOR ART

Radomes are covers, which are substantially transparent to radar beams, of a radar sensor that emits radar beams, and preferably also receives them again, in order to be able on this basis to produce as image of the surroundings of the radar sensor or to be able to generate information in this respect.

Such radomes are used in motor vehicles in order to be able to cover radar sensors, for example in the front end of the vehicle, to protect the radar sensor from dirt, water, ice or snow and other unwanted influences. It is known in this respect that the radome may also be electrically heated, in order for example that is winter icing, a layer of water or a layer of snow can be avoided or removed. This is desired because the function of the radar sensor is sometimes greatly impaired by such a layer.

Such radomes are disclosed for example by DE 10 2013 012 785 A1. There, a series of wires are placed between two films which are thermoformed and back-molded with a plastic.

EP 1 160 914 B1 discloses a radome in which the radome consists of a polycarbonate that has formed struts which are vapor-coated with electrically conductive chromium or indium. This radome also can be electrically heated by means of an electrical current flow through the coating.

Such designs tend to be complicated and/or expensive.

Summary of the Invention, Problem, Solution, Advantages

The invention therefore addresses the problem of providing a radome that can be produced in an easy and uncomplicated way and nevertheless can be produced inexpensively. The invention also addresses the problem of providing a method for producing a radome that provides an easy and inexpensive procedure for producing a radome.

The problem according to the invention with respect to the method is solved by the features of claim 1.

An exemplary embodiment of the invention relates to a method for producing a heatable radome, wherein a flexible printed circuit board with a metallic structure is used and the flexible printed circuit board is stamped and back-molded with a thermoplastic material. As a result, a flexible printed circuit board in the form for example of a film printed or etched with metallic conductor tracks can be stiffened by the back-molding in such a way that the resultant sheet-like structure can be used as a means for heating the radome. The stamping may be performed for example by hot stamping.

It is particularly advantageous in this case if the flexible printed circuit board consists of a flexible film that has a metallic structure. Thus, a structure that meets the spatial requirements for the radome can be easily created, because the film with the metallic structure provided on it can be easily shaped.

It is particularly advantageous in this case if the film is a laminate film, such as in particular a metallized laminate film of plastic. This allows a number of layers to be provided, which increases the stability of the film.

It is also particularly advantageous in this case if the film comprises PI, PEN or PC, that is to say is for example such a film. Here, PI stands for polyimide, PC for polycarbonate and PEN for polyethylene naphthalate.

It is in this case also advantageous according to one embodiment of the invention if the thermoplastic material is back-molded on the side of the film with the metallic structure. In this way, the back-molded plastic covers over the conductor tracks of the metallic structure. If an adhesive bonding strength is not required, or perhaps only partially, a covering of the relevant region with a separating film may be performed.

According to the inventive concept, it is in this case advantageous if the metallization consists of copper, the metallized structure in particular being etched. In this case, a sheet-like metallic layer may be provided, such as a copper layer, which can be re-worked by etching technology into a rather finely structured metallic structure.

It is in this case also advantageous if a predefined surface structure is created to improve the adhesive bonding of the back-molded plastic on the film. This may be performed by mechanical or chemical pretreatment.

It is thus advantageous if the surface structure is obtained by stamping impressions into a surface layer of the liquid, adhesive-like component of the film. In this case, the liquid adhesive component of the film represents a melted region, such as in particular a surface region, of the film.

It is also advantageous if the film is pre-stamped before the back-molding. This allows improved interlocking of the film material with the back-molded plastic to take place.

It is also advantageous if the sheet-like plastic element thus created is connected to a front panel. As a result, a covering can be performed in a way that meets the optical requirements of a radome, for example in the front end of a vehicle.

The problem according to the invention with respect to the radome is solved by the features of claim 11.

An exemplary embodiment of the invention relates to a heatable radome comprising a sheet-like plastic element with a metallic structure, wherein the plastic element consists of a film with back-molded thermoplastic material, in particular by a method described above.

It is in this case also advantageous if the plastic element created in this way is provided with a front panel.

Further advantageous refinements are described by the following description of the figures and by the subclaims.

BRIEF DESCRIPTION OF THE DRAWINGS

The invention is explained in more detail below on the basis of at least one exemplary embodiment with reference to the figures of the drawing, in which.

PREFERRED EMBODIMENT OF THE INVENTION

Figure 1:
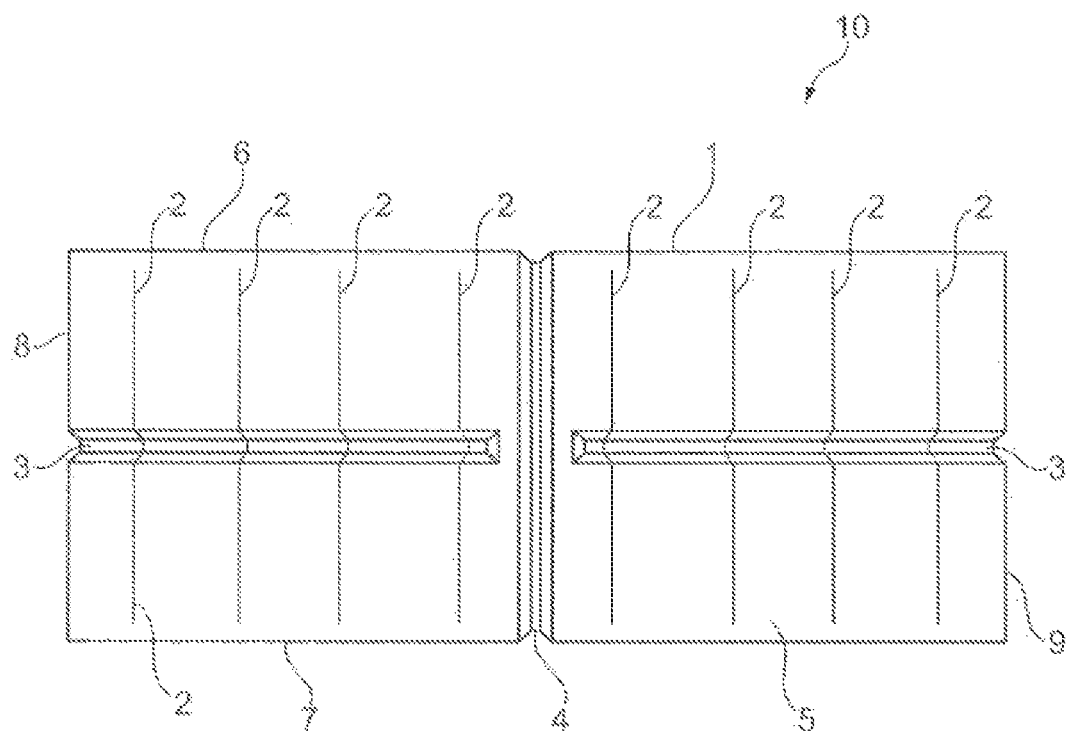
FIG. 1 shows a schematic representation of a radome according to the invention.

FIG. 1 shows a flexible printed circuit board 1, formed as a film 5, with a metallic structure 2. The film 5 is formed as substantially rectangular and has groove-like impressions 3, 4. The impressions 3, 4 are provided in various configurations. One of the impressions 4 runs through the film 5 from the top to the bottom in FIG. 1, from one longitudinal side 6 to the opposite longitudinal side 7. The other two impressions 3 run from one of the narrow sides 8, 9 in each case in the direction of the middle, but they do not extend as far as the middle.

The metallic structure 2 consists of linear metallic ridges, which may be produced from a sheet-like metallic structure, for example by etching.

This film 5 is coated by back-molding with a thermoplastic material 11. This can be seen in FIG. 2.

Figure 2:
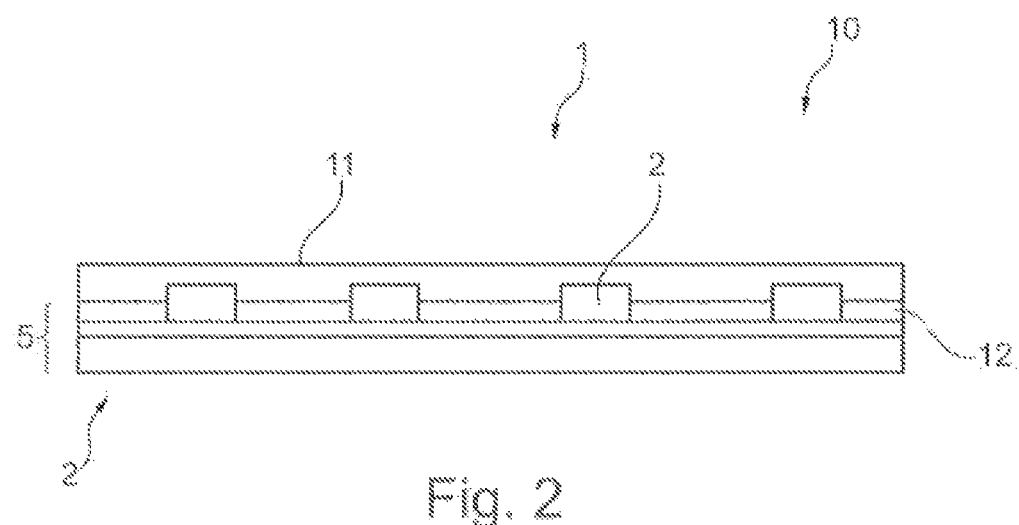
FIG. 2 shows a sectional representation of the radome.

FIG. 2 shows a section of a radome 10, wherein a flexile printed circuit board 1, which is formed in particular as a film 5 and has a metallic structure 2. In a form given by way of example, the metallic structure 2 is provided by means of linear strips, but it may also be formed in other ways.

The flexible printed circuit board 1 is hot-stamped and has impressions 3, 4, which cannot however be seen in FIG. 2. Furthermore, the flexible printed circuit board 1 is back-molded with a thermoplastic material 11. In this case, the back-molded plastic is applied on the side of the film 5 on which the metallic structure 2 is applied. The back-molded plastic in this case covers the metallic structure, at least in certain regions.

The film 5 is preferably a laminate film, such as in particular a metallized laminate film of plastic. In this case, the film is preferably a film that comprises PI, PEN or PC. Here, PI stands for polyimide, PC for polycarbonate and PEN for polyethylene naphthalate.

The metallization advantageously consists of copper, the metallized structure in particular being etched. Alternatively, the metallization may also consist of some other material, for example of aluminum or the like. The application of the structure may also be performed in some other way.

To improve the adhesive bonding of the back-molded plastic 11 on the film 5, a predefined surface structure may be produced, such as for example by a pretreatment. As a result, a layer 12 that preferably serves for increased bonding with the back-molded plastic is created on the surface of the film. The surface structure may for example be obtained by stamping impressions into a surface layer of the liquid, adhesive-like component of the film.

Figure 3:
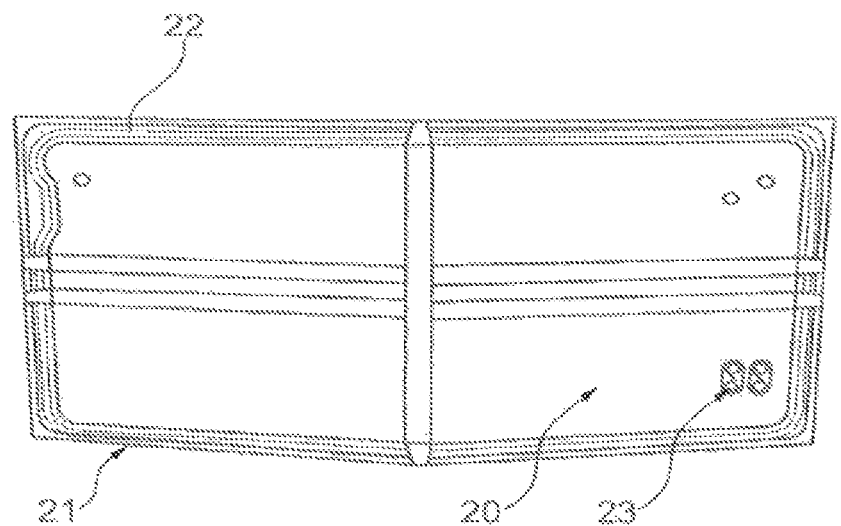
FIG. 3 shows a schematic representation of a further exemplary embodiment.

FIG. 3 shows a further exemplary embodiment of a back-molded film 20. This film is back-molded with a thermoplastic material 21, which also projects beyond the film 20 at the edge 22. Incorporated terminal contacts 23 can also be seen, for the electrical contacting of the metallic structure, which cannot however be seen in FIG. 3.

Figure 4:
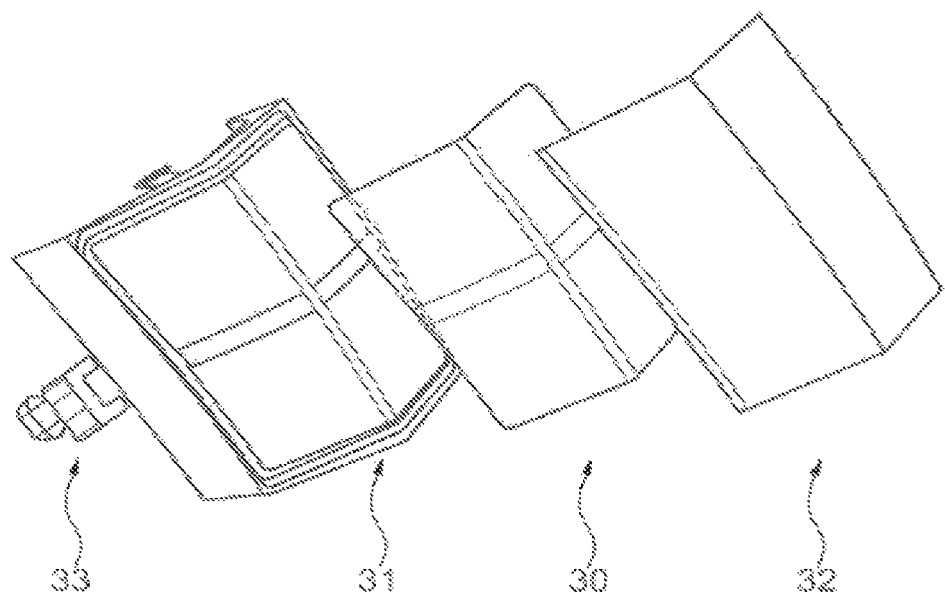
FIG. 4 shows an exploded representation of the radome as shown in FIG. 3 with a front panel.

FIG. 4 shows in a kind of exploded representation comprising a film 30 with metallization. This film is back-molded with a thermoplastic material and forms the element, shown on the left, of the film with back-molded plastic 31. A front panel 32 may be arranged on it. Furthermore, a connector 33 can also be seen, serving for the electrical connection of the heatable radome.

LIST OF DESIGNATIONS 1 flexible printed circuit board
2 metallic structure
3 impression
4 impression
5 film
6 longitudinal side
7 longitudinal side
8 narrow side
9 narrow side
10 radome
11 back-molded plastic
12 layer
20 back-molded film
21 thermoplastic material
22 edge
23 terminal contact
30 film
31 film with hack-molded plastic
32 front panel
33 connector

The invention claimed is:

1. A radome comprising:
a sheet-like plastic element comprising a laminate film connected to a back-molded thermoplastic material,
wherein the laminate film is flexible and comprises a flexible printed circuit board which includes a metallized structure arranged on one side of the flexible printed circuit board and configured to carry an electric current to heat the radome,
wherein the laminate film comprises an adhesive layer on its outer surface,
wherein the metallized structure is arranged adjacent to the layer underneath the adhesive layer such that the metallized structure projects from the layer underneath the adhesive layer through the adhesive layer such that the metallized structure contracts the back-molded thermoplastic material,
wherein the back-molded thermoplastic material comprises terminal contacts for electrically connecting the metallic structure to a source of electricity, wherein the terminal contacts are accessible externally on the surface of the back-molded thermoplastic material.

2. The radome as claimed in claim 1, further comprising a front panel attached to the plastic element.

3. The radome as claimed in claim 1,
wherein the flexible printed circuit board comprises polyimide or polyethylene naphthalate.

4. The radome as claimed in claim 1,
wherein the back-molded thermoplastic material is arranged on the side of the laminate film having the metallized structure.

5. The radome as claimed in claim 1,
wherein the metallized structure comprises copper or aluminum.

6. The radome as claimed in claim 1,
wherein the side of the laminate film adjacent to the back-molded thermoplastic material comprises a surface structure obtained by mechanical or chemical pretreatment of the adhesive layer prior to attachment of the back-molded thermoplastic material such that an interlocking between the laminate film and the back-molded thermoplastic material is achieved, which increases a bond strength between the laminate film and the back-molded thermoplastic material.

7. The radome as claimed in claim 6,
wherein the surface structure comprises impressions generated by mechanical stamping of the plastic element.

8. The radome as claimed in claim 1,
wherein the laminate film comprises two long sides and two short sides, wherein a first groove-like impression in the laminate film runs between the two long sides, wherein a second and third groove-like impression in the laminate film run from the two short sides toward a center region, each terminating before reaching the first groove-like impression.

9. The radome as claimed in claim 8,
wherein the metallized structure comprises strips of metallic material arranged parallel to the first groove-like impression.

10. A radome comprising:
a sheet-like plastic element comprising a laminate film connected to a back-molded thermoplastic material,
wherein the laminate film is flexible and comprises a flexible printed circuit board which includes a metallized structure arranged on one side of the flexible printed circuit board and configured to carry an electric current to heat the radome,
wherein the laminate film comprises an adhesive layer on its outer surface,
wherein the metallized structure is arranged adjacent to the layer underneath the adhesive layer such that the metallized structure projects from the layer underneath the adhesive layer through the adhesive layer such that the metallized structure contracts the back-molded thermoplastic material,
wherein the back-molded thermoplastic material comprises terminal contacts for electrically connecting the metallic structure to a source of electricity, wherein the terminal contacts are accessible externally on the surface of the back-molded thermoplastic material,
wherein the metallized structure comprises copper or aluminum,
wherein the side of the laminate film adjacent to the back-molded thermoplastic material comprises a surface structure obtained by mechanical or chemical pretreatment of the adhesive layer prior to attachment of the back-molded thermoplastic material such that an interlocking between the laminate film and the back-molded thermoplastic material is achieved, which increases a bond strength between the laminate film and the back-molded thermoplastic material,
wherein the surface structure comprises impressions generated by mechanical stamping of the plastic element,
wherein the metallized structure comprises strips of metallic material arranged parallel to the first groove-like impression.

* * * * *